(12) United States Patent
Sheredy et al.

(10) Patent No.: US 10,855,278 B1
(45) Date of Patent: Dec. 1, 2020

(54) IC LAYOUT TILES WITH INTERNAL CHANNEL FOR SIGNAL DISTRIBUTION

(71) Applicant: CREDO TECHNOLOGY GROUP LIMITED, Grand Cayman (KY)

(72) Inventors: Joe Sheredy, San Jose, CA (US); Lawrence Chi Fung Cheng, San Jose, CA (US)

(73) Assignee: CREDO TECHNOLOGY GROUP LIMITED, Grand Cayman (KY)

( * ) Notice: Subject to any disclaimer, the term of this patent is extended or adjusted under 35 U.S.C. 154(b) by 0 days.

(21) Appl. No.: 16/544,810

(22) Filed: Aug. 19, 2019

(51) Int. Cl.
*G06F 1/10* (2006.01)
*H03K 19/0175* (2006.01)

(52) U.S. Cl.
CPC ....... *H03K 19/017509* (2013.01); *G06F 1/10* (2013.01)

(58) Field of Classification Search
CPC .............................. G06F 1/10; H03K 19/0175
USPC ......................................................... 327/565
See application file for complete search history.

(56) References Cited

U.S. PATENT DOCUMENTS

| 6,396,303 | B1* | 5/2002 | Young | H03K 19/1737 326/39 |
| 9,606,573 | B1* | 3/2017 | Ebeling | G06F 1/10 |
| 10,068,048 | B1* | 9/2018 | Eslami Dehkordi | G06F 30/398 |

OTHER PUBLICATIONS

"Addressing the Power-Performance IC Design Conundrum: A Novel Clock Design Technique to Reduce Power and Increase Performance." Cyclos Semiconductor, Inc., (Jun. 1, 2012). Retrieved from http://www.cyclos-semi.com/pdfs/time_to_change_the_clocks.pdf.
Jayakumar, Nikhil, et al. "Design and Tuning of a Tree-Mesh Clock Distribution." Juniper Networks presentation International Symposium on Physical Design, Jul. 2013; www.ispd.cc/slides/2013/7_jayakumar.pdf.
"Semiconductor Intellectual Property Core" Wikipedia. Mar. 9, 2019 https://en.wikipedia.org/w/index.php?title=Semiconductor_intellectual_property_core&oldid=886997081.

* cited by examiner

*Primary Examiner* — William Hernandez
(74) *Attorney, Agent, or Firm* — Ramey & Schwaller LLP; Daniel J. Krueger

(57) ABSTRACT

Modular layout design units are provided with an internal channel for multi-directional distribution of a shared signal. In one illustrative embodiment, an integrated circuit includes: one or more modular units, each modular unit having an internal channel for signal distribution. The internal channel possesses: an edge connection on each edge of the modular unit; a hub node coupled to each edge connection by a respective bi-directional buffer having an incoming buffer and an outgoing buffer with at least one of the incoming and outgoing buffers disabled, the bi-directional buffers cooperating to steer a signal from a selectable one of the edge connections to one or more of the other edge connections; and a tap providing the signal for use by internal circuitry of the modular unit.

20 Claims, 3 Drawing Sheets

IC LAYOUT TILES WITH INTERNAL CHANNEL FOR SIGNAL DISTRIBUTION

BACKGROUND

Most integrated circuit devices have become so complex that it is impractical for electronic device designers to design them from scratch. Instead, electronic device designers rely on predefined modular units of integrated circuit layout designs, arranging and joining them as needed to implement the various functions of the desired device. Each modular unit has a defined interface and behavior that has been verified by its creator. Though each modular unit may take a lot of time and investment to create, its availability for re-use and further development cuts product cycle times dramatically and enables better products. The predefined units can be organized hierarchically, with a given unit incorporating one or more lower-level units and in turn being incorporated within higher-level units. Many organizations have libraries of such predefined modular units for sale or license, including, e.g., embedded processors, memory, interfaces for different bus standards, power converters, frequency multipliers, sensor transducer interfaces, to name just a few. The predefined modular units are also known as cells, blocks, cores, and macros, terms which have different connotations and variations ("IP core", "soft macro") but are frequently employed interchangeably.

The modular units can be expressed in different ways, e.g., in the form of a hardware description language (HDL) file, or as a fully-routed design that could be printed directly to a series of manufacturing process masks. Fully-routed design files are typically process-specific, meaning that additional design effort would usually be needed to migrate the modular unit to a different process or manufacturer. Modular units in HDL form require subsequent synthesis, placement, and routing steps for implementation, but are process-independent, meaning that different manufacturers can apply their preferred automated synthesis, placement, and routing processes to implement the units using a wide range of manufacturing processes. By virtue of their higher-level representation, HDL units may be more amenable to modification and the use of variable design parameters, whereas fully-routed units may offer better predictability in terms of areal requirements, reliability, and performance. While there is no fixed rule, digital module designs are more commonly specified in HDL form, while analog and mixed-signal units are more commonly specified as a lower-level, physical description.

When the modular units have compatible interfaces, the electronic device designer can route their interface signals together by using short, simple conductors, or even in some cases by abutting the modular units together such that the input and output nodes for their interface signals connect together. More commonly, however, the electronic device designer is expected to "stitch" the modular units together using buffers and latches to convey the interface signals from one unit to the next. As more units are combined and signal frequencies increase, the stitching becomes more complex, particularly with respect to distributing shared signals to multiple units without degradation.

SUMMARY

Accordingly, there are disclosed herein tile-able layout design units having an included channel for multi-directional distribution of a shared signal. In one illustrative embodiment, an integrated circuit includes: one or more modular units, each modular unit having an internal channel for signal distribution. The internal channel possesses: an edge connection on each edge of the modular unit; a hub node coupled to each edge connection by a respective bi-directional buffer having an incoming buffer and an outgoing buffer with at least one of the incoming and outgoing buffers disabled, the bi-directional buffers cooperating to steer a signal from a selectable one of the edge connections to one or more of the other edge connections; and a tap providing the signal for use by internal circuitry of the modular unit.

In another illustrative embodiment, a method of manufacturing an integrated circuit includes: arranging multiple modular units to form an array, each modular unit in the array having an internal channel for signal distribution to adjacent modular units via edge connections on each edge of the modular unit, the internal channel including a hub node coupled to each edge connection by a respective bi-directional buffer having an incoming buffer and an outgoing buffer; coupling a source of a signal to one of the edge connections; and selectively disabling incoming and outgoing buffers of said bi-directional buffers to provide a signal distribution path from the source to each of the multiple modular units.

In yet another illustrative embodiment a method of distributing a clock signal includes: providing multiple modular units each having an internal channel; electrically connecting each of the multiple modular units to one or more of the other multiple modular units via the internal channel's edge connections to extend the internal channel across each of the multiple modular units; coupling a clock signal to an edge connection of one of said multiple modular units; and disabling selected ones of the internal channel's outgoing and incoming buffers to configure the internal channel as a clock distribution tree that conveys the clock signal to each of the multiple modular units.

Each of the foregoing embodiments may be implemented individually or in combination, and may be implemented with one or more of the following features in any suitable combination: 1. the modular unit has four edges. 2. the bi-directional buffers steer the signal from the selectable one of the edge connections to each of the other edge connections. 3. the one or more modular units include multiple modular units abutted together to form an array, the abutment electrically connecting edge connections of adjacent modular units. 4. some of the bi-directional buffers are disabled to prevent loops and/or conflicts within the signal distribution path. 5. the signal is a clock signal. 6. the internal circuitry of the modular unit comprises a deserializer that derives a sampling clock from said clock signal. 7. the tap comprises a buffer connecting the hub node to the internal circuitry. 8. each connection between one of the bi-directional buffers and the respective edge connection is an arm segment. 9. said tap is one of multiple taps from a given arm segment. 10. one or more arm segments are tapped to supply the signal for use by internal circuitry of the modular unit. 11. the bi-directional buffers in each of the multiple modular units cooperate to steer a signal from a selected one of the edge connections to one or more of the other edge connections. 12. said arranging includes abutting the multiple modular units to electrically connect the edge connections of adjacent modular units.

DETAILED DESCRIPTION

Figure 1A:
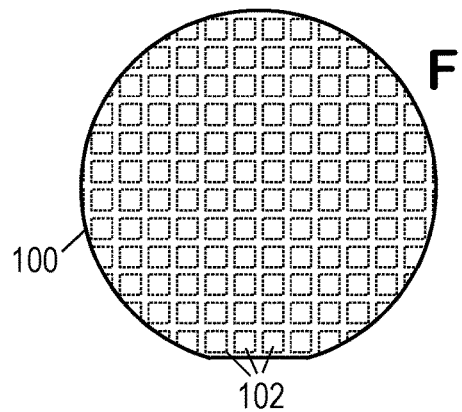
FIG. 1A is a plan view of a wafer patterned with integrated circuit devices.

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

FIG. 1A shows a plan view of a semiconductor wafer 100, patterned to form an array of integrated circuits 102 which can be diced apart into IC chips and packaged as components for assembly into electronic devices. The IC chips can be packaged individually or combined into multi-chip modules using an interposer and/or package substrate, in either case employing a ball grid array or wire lead frame to provide external contacts for electrically connecting to other circuit components, usually via a printed circuit board. Each IC chip can implement digital logic, analog functionality, and/or mixed signal circuitry.

The patterning of wafers is performed by a semiconductor fabrication plant ("fab") applying a series of cleaning, alignment, deposition, patterning, etching, implantation, and related processes. The "recipe" (the sequence of patterns and process steps) employed determines the functionality of the resulting integrated circuits. Electronic device designers working for the fab's customers, or for the company that owns the fab, specify the recipe to be used. As described in the background, the designers facilitate the design process by relying on modular layout design units to implement desired elements of the integrated circuit. These modular units may be predefined units obtained from an existing library or from vendors that specialize in designing the desired type of element.

Figure 1B:
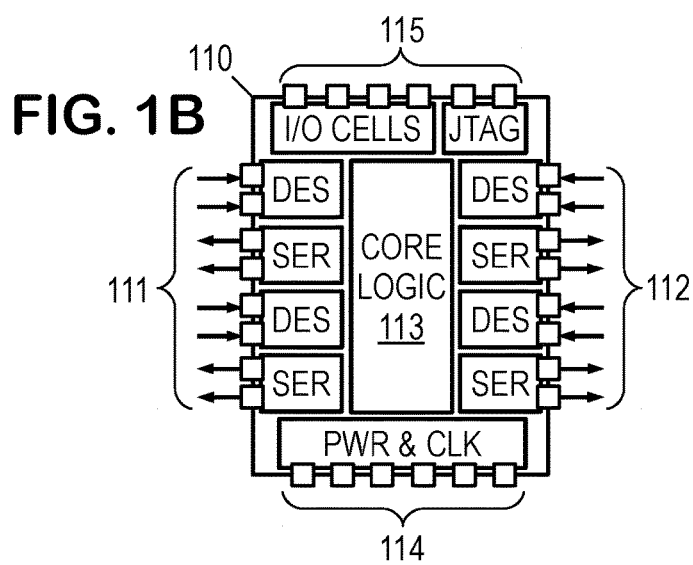
FIG. 1B is a block diagram of an illustrative application-specific integrated circuit.

FIG. 1B shows an illustrative high-speed serializer/deserializer ("SerDes") retimer chip 110, which serves here as an example of an integrated circuit device. Chip 110 includes SerDes modules with contacts 111 for receiving and transmitting high-rate serial bitstreams across four lanes in one direction, additional SerDes modules with contacts 112 for receiving and transmitting the high-rate serial bitstreams across four lanes in another direction, and core logic 113 for handling channel communications protocol while buffering interconnections between the two directions. Supporting modules and contacts 114, 115, such as power regulation and distribution, clock generation, digital input/output lines for control, and a JTAG module for built-in self testing. The chip designer can design the device by placing the predefined modular units for the serializers, deserializers, power, clock generator, I/O cells, and JTAG; and routing the interconnections between the modular units with a bit of supporting logic.

Figure 1C:
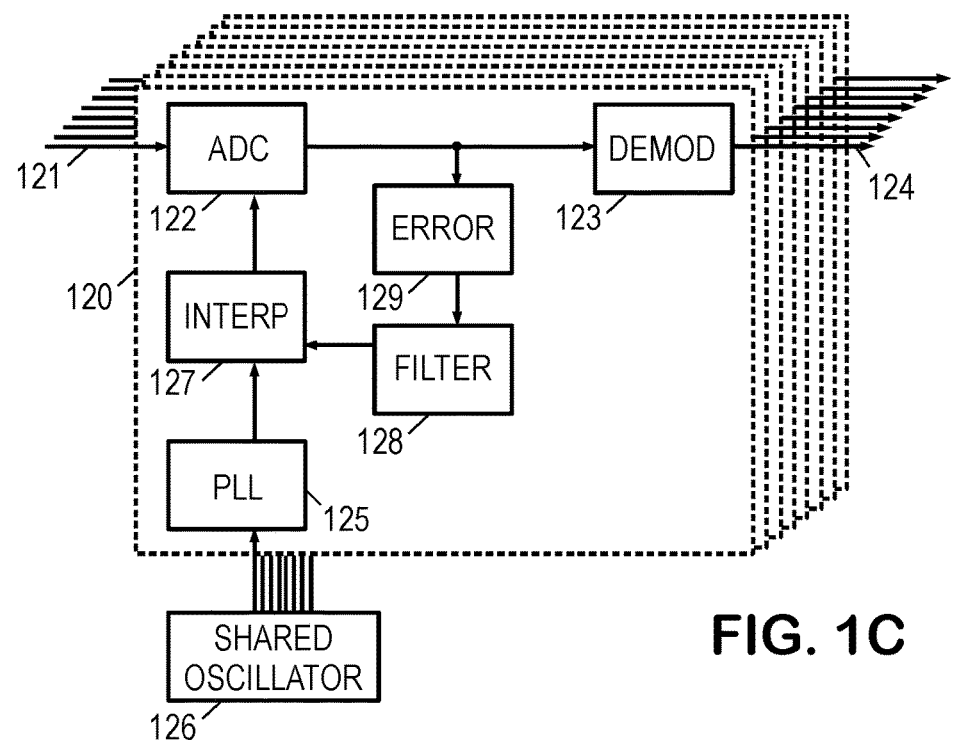
FIG. 1C is a block diagram of multiple deserializer instances sharing a clock.

The retimer chip employs eight instances of a deserializer module 120 which may share a common clock source as shown in FIG. 1C. Each instance 120 digitizes a receive signal 121 with an analog-to-digital converter 122 to obtain a digital receive signal which is then processed by a demodulator 123 to extract the represented bitstream 124. A phase lock loop 125 obtains a clock signal from the shared oscillator 126, frequency multiplying it as needed to generate a channel clock signal having a frequency associated with the symbol rate of receive signal 121. An phase interpolator 127 adjusts the phase of the channel clock signal as needed to supply a sampling clock signal to ADC 122. The phase interpolator 127 may also be employed to provide a small frequency offset to the sampling clock as needed to compensate for frequency drift. The phase and frequency offset is determined by a feedback loop filter 128 or error processor operating on a timing error signal from timing error sensor 129. The feedback loop operates to minimize the timing error, enabling the sampling clock to track any reasonable variation in the phase and frequency of the receive signal. Not shown, but potentially also included, are channel symbol decoders, serial-to-parallel converters, framing alignment modules, demultiplexers, FEC decoders, and other such elements that implement the desired channel communications protocol and enable reliable extraction of the communicated data.

Though the foregoing summary of deserializer operation may seem facile, the actual implementation can be extremely challenging, especially at very high channel symbol rates requiring tight control over jitter and noise (symbol rates above, say, 5 GHz). Accordingly, chip designers may be keenly motivated to use predefined modular units made available for this purpose by specialty vendors. But to assure that the predefined modular units operate as desired, the designers need to supply the predefined modules with a high quality clock signal having minimal jitter and noise, because any jitter on the clock channel accumulates and translates into loss of performance margin by the modular units. It can be very challenging for the designer to distribute a low noise clock signal at either the die, package substrate or PCB level, particularly when integrating multiple instances of an modular unit whose performance depends on the low noise clock source. Care must be taken to isolate the clock tree from noise sources and to also ensure the clock tree has adequate buffering in the chain to prevent unnecessary jitter due to slowing slew rates. To the maximum extent possible, it is preferred for the specialists (in this case, the designers of the predefined modules) to handle the clock signal distribution rather than relying on the chip designer to attempt routing of the clock signals while taking the stringent measures needed to protect against incidental sources of jitter and noise.

Accordingly, there is provided herein a clock channel grid implemented inside the predefined modular units, with a configurable distribution direction that enables multiple instances of the modular layout design unit to receive and/or send the reference clock signal merely by abutment or, if necessary, via short interconnection traces that do not require additional buffering. The clock channel grid includes all necessary noise isolation and buffering are within the layout design blocks, thereby facilitating the designer's job. Implementing the clock channel in this manner may also provide the potential benefits of reducing the number of identical clock sources coming into the package and thereby reducing overall bill-of-material (BOM) costs.

This distribution-by-abutment feature enables multiple instances of the chosen modular unit to be assembled by space-filling abutment, i.e., "tiling", as discussed further below. The modular units having this feature may accordingly be termed "tiles", and may be designed with 2-fold (rectangular or parallelogram), 3-fold (triangular), 4-fold (square), or 6-fold (hexagonal) symmetry on the arrangement of clock-distribution ports, though in the absence of such symmetries mirroring may optionally be employed to provide the abuttable connections.

Figure 2A:
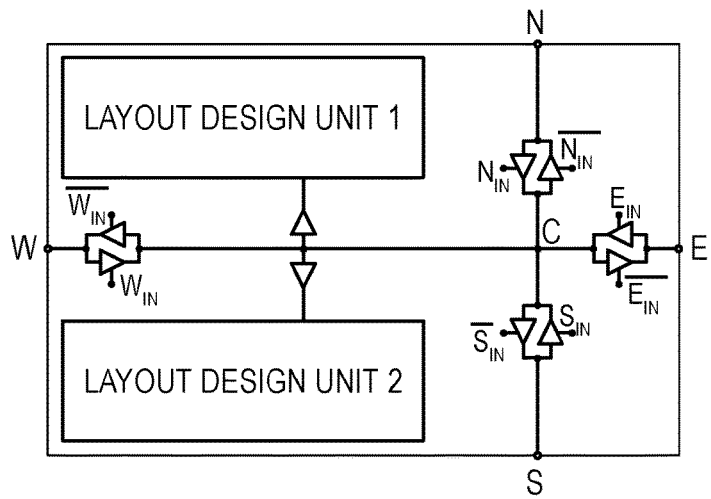
FIG. 2A is a schematic of a first illustrative modular block.

FIG. 2A is a schematic of an illustrative modular unit having an internal channel for distributing a shared signal such as a low-jitter clock signal. The modular unit includes one or more sub-units (labeled in FIG. 2 as Layout Design Unit x, and in FIG. 3 as "LDU") to implement the desired functions (such as serializer and deserializer functionality), as well as the internal channel routed around, between, or through the one or more sub-units. The internal channel provides a "central" node C that is coupled by bi-directional buffers to channel connections on each edge of the modular unit. In the illustrated embodiment, the modular unit is provided with a rectangular shape having a channel connection on each of the four edges. The four connections are labeled in the figure as W, N, E, S. The bi-directional buffers coupling each channel connection to the node include an "outgoing" buffer that buffers a signal from the central node C to the channel connection on one of the edges, and an "incoming" buffer that buffers a signal from the edge connection to the central node C. Either the outgoing buffer or the incoming buffer is enabled, but not both. For edges where it is desired to terminate the channel connection, both the incoming and outgoing buffers may be disabled.

Figure 2B:
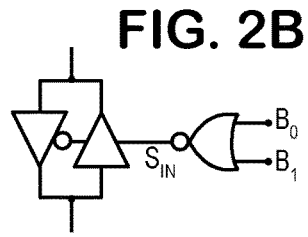
FIG. 2B is a schematic of a second illustrative modular block.

In FIG. 2A, four logic signals are used to indicate the edge connection through which the signal enters the modular unit: Win, Nin, Ein, Sin. While some system embodiments potentially allow more than one of these signals to be true, it is usually preferred that the signal distribution path have the structure of a tree graph, such that each node has exactly one parent (i.e., only one signal source). In this case, exactly one of the four signals is true, enabling the four options to be represented using two bits $B_1 B_0$. While different binary code assignments are possible, one possible coding uses 00, 01, 11, and 10 to respectively indicate S, E, N, and W as the signal's entering edge. In this instance, logic signal Sin can be expressed as $-(B_1+B_0)$ and the southern bi-directional buffer implemented as shown in FIG. 2B. The other signals are expressible as $Ein=(-B_1)*(B_0)$, $Nin=(B_1)*(B_0)$, $Win=(B_1)*(-B_0)$.

Since the distribution path is established during the layout phase and need not change thereafter, the logic signals, or equivalently, the enable nodes for each of the incoming and outgoing buffers, can be tied high or low as part of the manufacturing process to create suitable steering paths for distributing the shared signal. Alternatively, the enable nodes for each of the incoming and outgoing buffers can be tied to programmable register bits, thereby providing full flexibility to the user at power-up under the sole constraint that the programmed bit states do not cause any signal conflicts that could damage the device. The signal paths can be implemented differentially or in single-ended fashion, with suitable buffer gains, routing dimensions, and/or shield conductors, as needed to minimize environmental sources of signal noise and jitter.

Figure 2C:
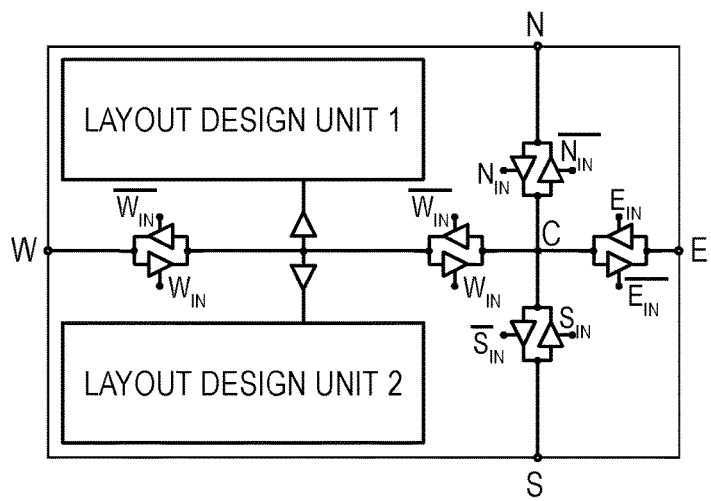
FIG. 2C is a schematic of a third illustrative modular block.
Figure 2D:
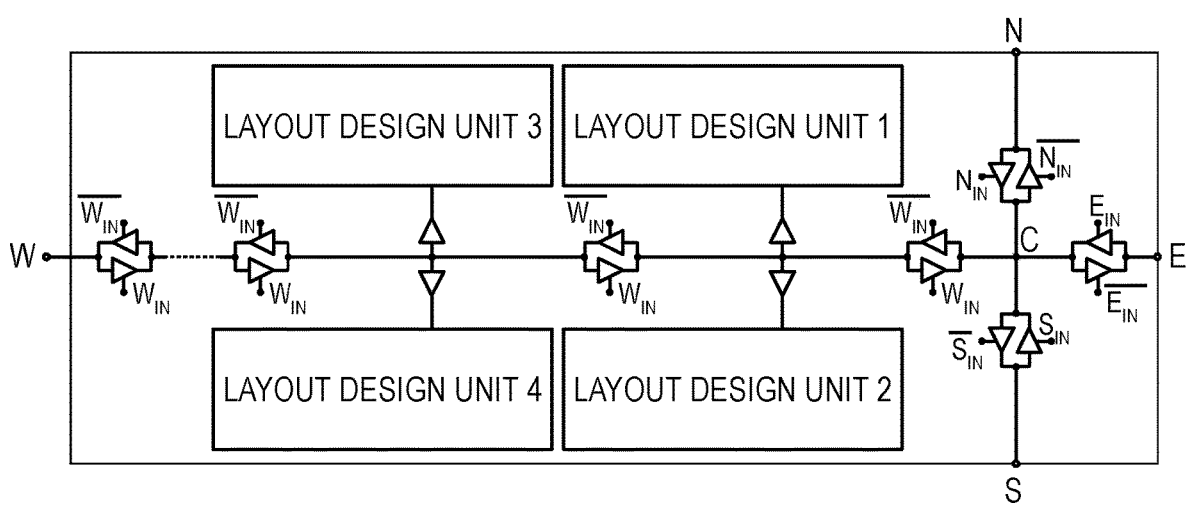
FIG. 2D is a schematic of a fourth illustrative modular block.

In FIG. 2A, the clock signal is supplied to the functional sub-unit(s) by one or more signal buffers from the central node C, but additional bi-directional buffers can be included to prevent capacitive loading from slowing signal slew rates. FIG. 2C shows an embodiment in which the center node C is employed solely for signal steering, and an additional bi-directional buffer is provided create an additional segment in the "west-side" channel arm for supplying the signal to the functional sub-unit(s) and to/from the a bi-directional buffer near the edge connection. This principal can be extended as shown in FIG. 2D to provide additional segments along the distribution channel as needed to support an indefinite number N of functional sub-units. As a practical matter, the number of functional sub-units may be limited by the inherent jitter of each buffer stage which, as it accumulates, should still meet the signal specification requirements for total random jitter. Note that the segments need not be concentrated along one arm of the channel, but rather can be provided as needed along any or all of the channel arms.

Figure 3:
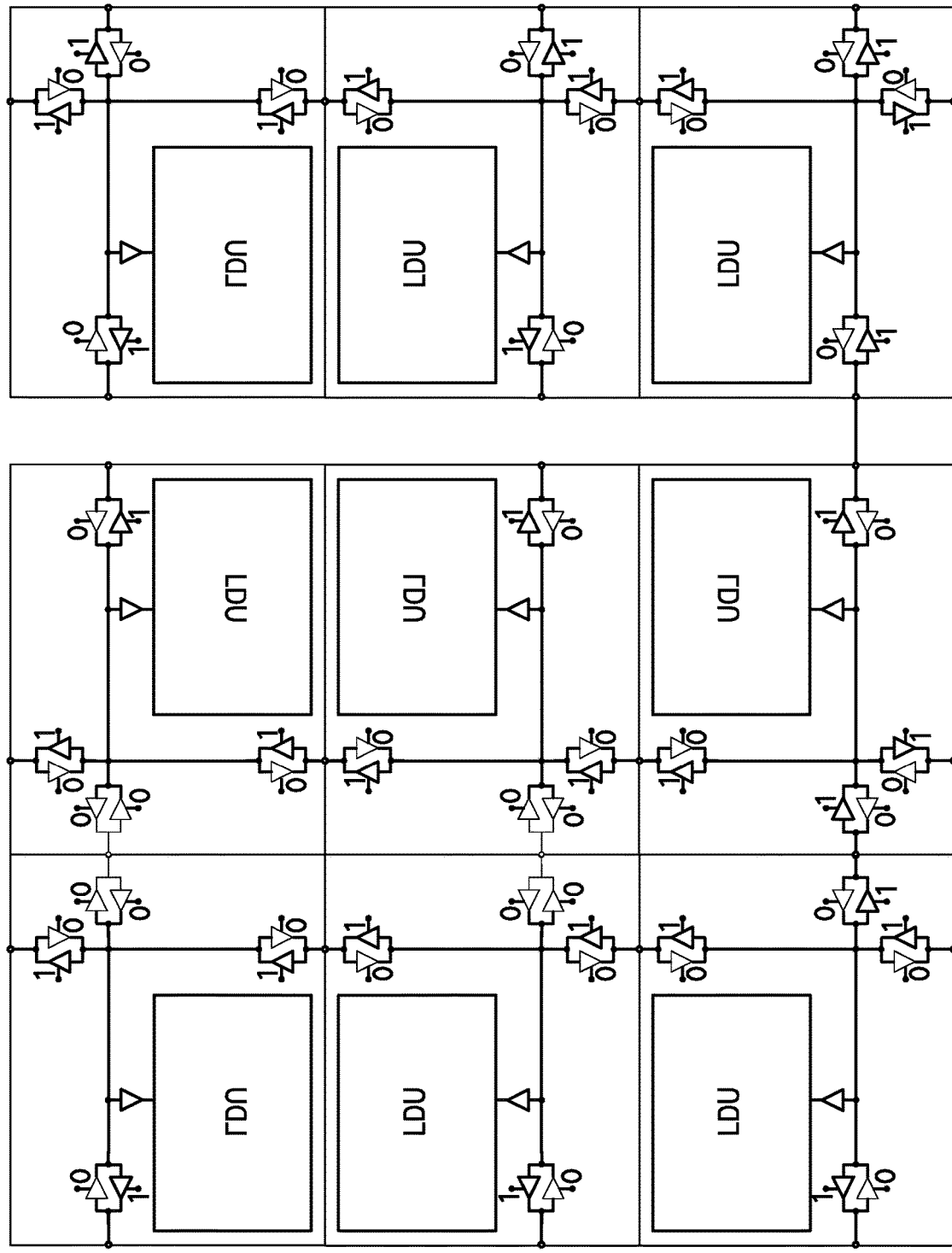
FIG. 3 is a schematic of an illustrative distribution tree implemented by abutted and locally-connected modular blocks.

FIG. 3 is a schematic showing an example of multiple modular units being abutted or placed in close proximity to enable the use of short interconnections, and an illustrative signal distribution tree that is formed by the internal channels. The enable node for each of the incoming and outgoing buffers is shown tied to a high (enabled) or low (disable) voltage rail, and the disabled buffers are shown with reduced line width to aid understanding of how the distribution channel takes on a tree structure. A differential comparator on the lower left converts a differential clock signal (CXP, CXN) into a single-ended signal which is then supplied to the lower edge connection of the lower left modular unit. In the lower left modular unit, the clock signal is used locally and distributed out each of the other three edges, though abutting connections are shown only for the top and right edges. The signal passing through the top edge is used by the middle left modular unit and passed out the top and left edges. The bi-directional buffer for the right edge is disabled to avoid forming a loop in the distribution path via the abutting center modular unit. Similarly, the upper left modular unit uses the signal locally and avoids distributing the signal to the right to prevent a loop in the distribution path via the abutting upper middle unit. Connections for further distribution are available on the top and left edges.

The lower middle modular unit receives the signal from its left edge connection, uses it locally, and distributes out each of its other edges. The center modular unit abuts the lower middle unit to receive the signal, and abuts the upper middle unit to distribute the clock signal via its top edge. The lower right modular unit is placed in close proximity to the lower middle unit, with a conductive interconnect linking the lower middle unit's right edge connection to the lower right unit's left edge connection. The middle right unit abuts to the top edge of the lower right unit to receive the signal, and abuts to the lower edge of the top right unit to pass the signal via its upper edge connection. In this fashion, the device designer is able to instantiate multiple modular units having an internal channel to provide distribution of a shared signal.

Note that in FIG. 3, mirroring of the modular units is employed to ensure alignment of the edge connections. This can be done because nearly all integrated circuits are functionally equivalent when mirrored. While such mirroring is usually convenient, it is not required if the connections are provided with the desired symmetry. The other signals employed by the modular units may be provided via different layers in the device design and/or via pad connections internal to the modular unit's silhouette. In the particular case of a SerDes device, the external signals may be supplied via ball-grid array pads.

The foregoing embodiments and principles may offer at least the following potential advantages: simplification of clock tree routing in high macro instances, built-in noise suppression for clock tree, built-in buffering of clock tree for long distance routing, and highly flexible design.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. An integrated circuit comprising: one or more modular units, each modular unit having an internal channel for signal distribution, the internal channel including:
   an edge connection on each edge of the modular unit;
   a hub node coupled to each edge connection by a respective bi-directional buffer having an incoming buffer and an outgoing buffer with at least one of the incoming and outgoing buffers disabled, the bi-directional buffers cooperating to steer a signal from a selectable one of the edge connections to one or more of the other edge connections; and
   a tap providing the signal for use by internal circuitry of the modular unit.

2. The integrated circuit of claim 1, wherein the modular unit has four edges, and wherein the bi-directional buffers steer the signal from the selectable one of the edge connections to each of the other edge connections.

3. The integrated circuit of claim 1, wherein the one or more modular units include multiple modular units abutted together to form an array, the abutment electrically connecting edge connections of adjacent modular units.

4. The integrated circuit of claim 3, wherein some of the bi-directional buffers are disabled to prevent a signal distribution path loop.

5. The integrated circuit of claim 1, wherein the signal is a clock signal.

6. The integrated circuit of claim 5, wherein the internal circuitry of the modular unit comprises a deserializer that derives a sampling clock from said clock signal.

7. The integrated circuit of claim 1, wherein the tap comprises a buffer connecting the hub node to the internal circuitry.

8. The integrated circuit of claim 1, wherein each connection between one of the bi-directional buffers and the respective edge connection is an arm segment, and wherein said tap is one of multiple taps from a given arm segment.

9. The integrated circuit of claim 1, wherein each connection between one of the bi-directional buffers and the respective edge connection is an arm segment, and wherein multiple such segments are tapped to supply the signal for use by internal circuitry of the modular unit.

10. A method of manufacturing an integrated circuit, the method comprising:
    arranging multiple modular units to form an array, each modular unit in the array having an internal channel for signal distribution to adjacent modular units via edge connections on each edge of the modular unit, the internal channel including a hub node coupled to each edge connection by a respective bi-directional buffer having an incoming buffer and an outgoing buffer;
    coupling a source of a signal to one of the edge connections; and
    selectively disabling incoming and outgoing buffers of said bi-directional buffers to provide a signal distribution path from the source to each of the multiple modular units.

11. The method of claim 10, wherein the bi-directional buffers in each of the multiple modular units cooperate to steer a signal from a selected one of the edge connections to one or more of the other edge connections, and wherein each of the modular units further includes a tap to provide the signal for use by internal circuitry of the modular unit.

12. The method of claim 10, wherein said arranging includes abutting the multiple modular units to electrically connect the edge connections of adjacent modular units.

13. The method of claim 12, wherein said some of the bi-directional buffers are fully disabled to prevent loops within the signal distribution path.

14. The method of claim 10, wherein the signal is a clock signal.

15. The method of claim 14, wherein internal circuitry in each of the modular units comprises a deserializer that derives a sampling clock from said clock signal.

16. A method of distributing a clock signal, the method comprising:
    providing multiple modular units each having an internal channel that includes:
      an edge connection on each edge of the modular unit;
      a hub node coupled to each edge connection by a respective bi-directional buffer having an incoming buffer and an outgoing buffer; and
      a tap providing the clock signal for use by internal circuitry of the modular unit;
    electrically connecting each of the multiple modular units to one or more of the other multiple modular units via the edge connections to extend the internal channel across each of the multiple modular units;
    coupling a clock signal source to an edge connection of one of said multiple modular units; and
    disabling selected ones of the outgoing and incoming buffers to configure the internal channel as a clock distribution tree that conveys the clock signal to each of the multiple modular units.

17. The method of claim 16, wherein the tap comprises a buffer connecting the hub node to the internal circuitry.

18. The method of claim 16, wherein each connection between one of the bi-directional buffers and the respective edge connection is an arm segment, and wherein said tap is one of multiple taps from a given arm segment.

19. The method of claim 16, wherein each of the multiple modular units has four edges.

20. The method of claim 16, wherein said electrically connecting includes abutting at least some of the multiple modular units to form an array, the abutment electrically connecting edge connections of adjacent modular units.

* * * * *